United States Patent [19]

Hahlganss

[11] 4,296,457
[45] Oct. 20, 1981

[54] APPARATUS FOR ELECTRICALLY CONNECTING A PLURALITY OF CONTACTS

[75] Inventor: Günter Hahlganss, Kriftel, Fed. Rep. of Germany

[73] Assignee: VDO Adolf Schindling AG, Fed. Rep. of Germany

[21] Appl. No.: 106,082

[22] Filed: Dec. 21, 1979

[30] Foreign Application Priority Data

Jan. 15, 1979 [DE] Fed. Rep. of Germany ....... 2901416

[51] Int. Cl.³ .............................................. H05K 01/14
[52] U.S. Cl. ................................. 361/413; 174/117 F; 174/117 FF; 361/398; 361/408
[58] Field of Search ........... 174/117 FF, 117 F, 72 A, 174/72 TR; 361/413, 414, 398, 408

[56] References Cited

U.S. PATENT DOCUMENTS

| 3,409,732 | 11/1968 | Dahlgreen | 361/414 |
| 3,546,775 | 12/1970 | Lalmond | 361/398 X |
| 3,718,842 | 2/1973 | Abbott | 361/398 X |
| 3,727,168 | 4/1973 | Henschen | 361/408 X |
| 3,772,776 | 11/1973 | Weisenburger | 361/398 X |
| 3,827,056 | 7/1974 | Vano | 361/398 X |
| 3,868,162 | 2/1975 | Ammon | 361/413 X |

OTHER PUBLICATIONS

Signaflo Wiring Systems, Bulletin E-7, pp. 4, 5, 6, 7, 8 and back of bull., published by ACI Incorporated, Princeton, N.J. 04/69.

Cechanek et al., Module Package, IBM Tech. Disclosure Bull., vol. 21, #6, Nov. 1978, pp. 2268 and 2269.

*Primary Examiner*—Richard R. Kucia
*Attorney, Agent, or Firm*—Eric P. Schellin

[57] ABSTRACT

Apparatus for electrically connecting a plurality of closely positioned contacts of a display device with a plurality of spaced contacts of an electronic control circuit includes a plurality of flexible printed circuit boards each having a narrow mid-section, outer areas having a width greater than the width of the mid-section and conductor lines extending from the mid-section for connection with a portion of the display device contacts to the outer areas with the spacing between the conductor lines increasing for connection with a portion of the electronic control circuit contact.

8 Claims, 5 Drawing Figures

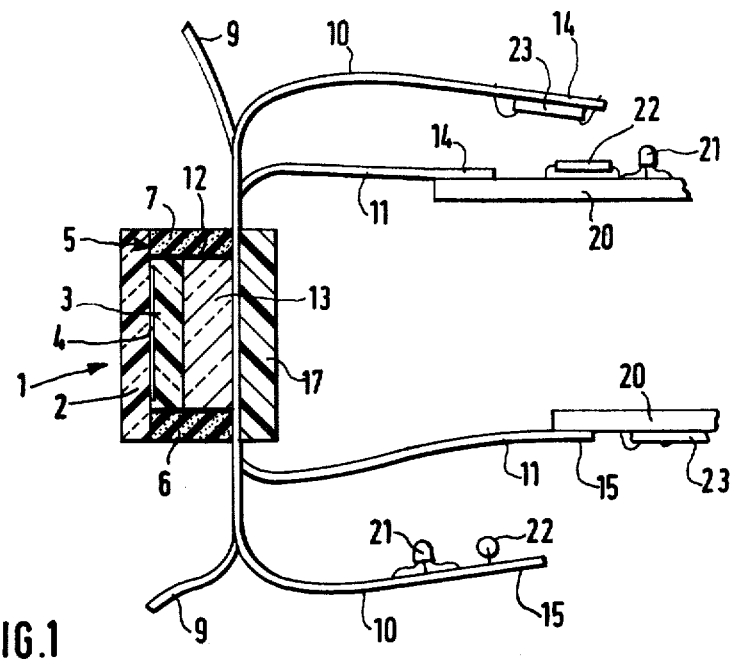
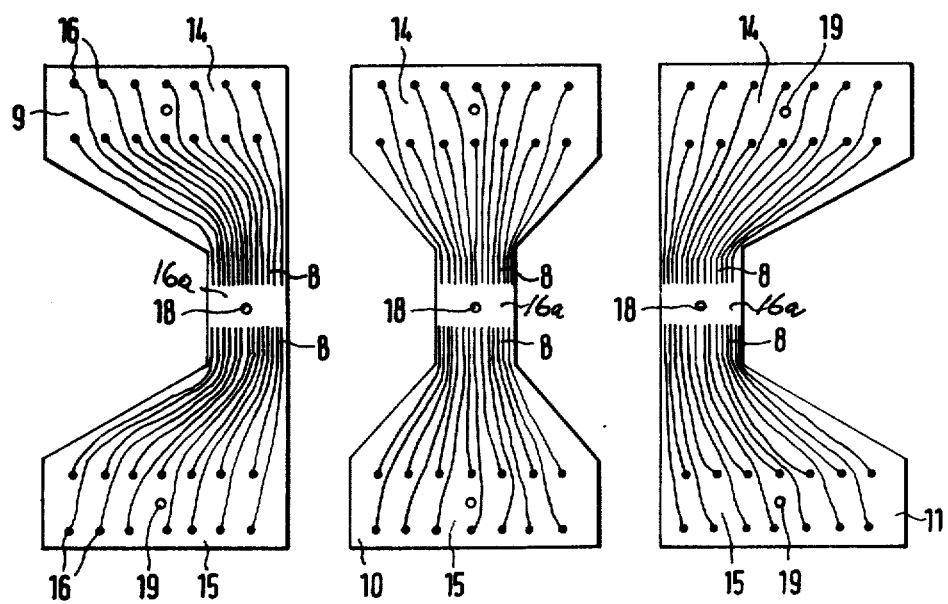
FIG.1
FIG.2a  FIG.2b  FIG.2c

APPARATUS FOR ELECTRICALLY CONNECTING A PLURALITY OF CONTACTS

BACKGROUND OF THE INVENTION

1. Field of the Invention

The present invention pertains to apparatus for electrically connecting contacts and, more particularly, to apparatus for electrical connection of a plurality of closely positioned contacts of an electronic unit, such as a display device, to the spaced contacts of an electronic control circuit.

2. Discussion of the Prior Art

It is known to connect the contacts of a display device, such as liquid crystal or vacuum fluorescent displays, to the conductor lines of a printed circuit board supporting an electronic control circuit for the display by means of a conductive rubber body positioned between and electrically connected with the contacts and the conductor lines. The conductive rubber body is formed of a plurality of electrically conductive, fiber-like contact elements extending over the thickness of the body and embedded in a rubber-elastic insulating material in laterally spaced relation. The conductor lines in the area of the display device are disposed closely adjacent to one another with a spacing corresponding to that of the display device contacts, and the conductor lines spread apart with increasing distance as they move away from the display device in a manner to permit discrete elements, such as transistors, resistors, condensors, and integrated circuit components, to be soldered to the free ends of the conductor lines without difficulty. The spreading apart of the conductor lines required for connection of the discrete elements results, in display devices having a plurality of adjacent contacts in a row, in printed circuit board dimensions in the direction of the display connection row many times larger than the length of the display connection row and, thus, creates great disadvantages in housing the display electronics in reasonable size cases.

SUMMARY OF THE INVENTION

Accordingly, it is a primary object of the present invention to overcome the above-mentioned disadvantages of the prior art by providing electrical connection apparatus having minimal space requirements while being simple to manufacture.

Another object of the present invention is to utilize a plurality of flexible printed circuit boards to establish electrical connections between display device contacts and electronic control circuit contacts, each of the flexible printed circuit boards having a narrow mid-section and wider outer areas with conductor lines extending from the mid-sections to the outer areas while the distance therebetween increases.

The present invention has a further object in that a plurality of flexible printed circuit boards are arranged to overlap at least partially such that the width of the printed circuit boards in the outer areas for connection with the discrete elements of the electronic control circuit is minimal and the elements of the electronic control circuit can be arranged in great packing density behind the display device due to the flexibility of the flexible printed circuit boards.

Some of the advantages of the present invention over the prior art are that the electrical connection apparatus can be manufactured inexpensively, and the control lines on the flexible printed circuit boards can terminate at ends spaced in accordance with customary screen measures to permit rapid fixation of discrete circuit elements on the printed circuit boards with little difficulty.

The present invention is generally characterized in an apparatus for electrically connecting a plurality of closely positioned contacts of a display device with a plurality of spaced contacts of an electronic control circuit comprising a plurality of flexible printed circuit boards each having a narrow mid-section, at least one outer area spaced from the mid-section having a width greater than the width of the mid-section and a plurality of conductor lines extending from the mid-section for connection with a portion of the closely positioned contacts of the display device to the outer area with the spacing between the conductor lines increasing for connection with a portion of the spaced contacts of the electronic control circuit.

Other objects and advantages of the present invention will become apparent from the following description of the preferred embodiment taken in conjunction with the accompanying drawings.

BRIEF DESCRIPTION OF THE DRAWINGS

FIG. 1 is a side view of connection apparatus according to the present invention utilized with a liquid crystal display device.

FIGS. 2a, 2b and 2c are plan views of the separate flexible printed circuit boards utilized with the connection apparatus of FIG. 1.

DESCRIPTION OF THE PREFERRED EMBODIMENT

Figure 3:
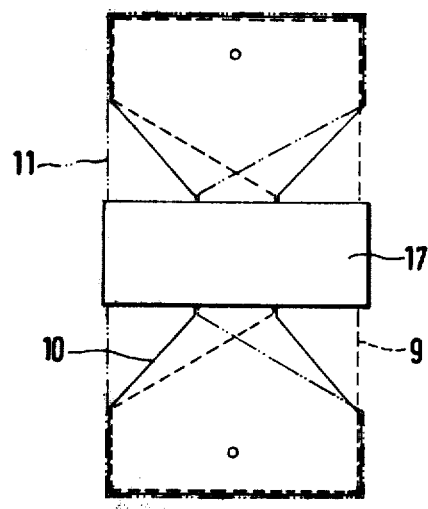
FIG. 3 is a rear view of the connection apparatus of the present invention.

Electrical connection apparatus according to the present invention is illustrated in FIG. 1 as utilized with a display device in the form of a liquid crystal cell 1 including two cell glasses 2 and 3 between which a liquid crystal material 4 is positioned. Electrodes (not shown) are arranged on the cell glasses 2 and 3 and are accessible at positions 5 for electrical connection via rubber strands 6 and 7 to the ends 8 of conductor lines on the flexible printed circuit boards 9, 10 and 11, as best shown in FIGS. 2a, 2b and 2c. A photoconductor 13 for illuminating the backside of the liquid crystal cell is disposed between the conductive rubber strands 6 and 7, the cell glass 3 and the flexible printed circuit boards.

Each of the flexible printed circuit boards 9, 10 and 11 has outer areas 14 and 15 on opposite sides of a narrow mid-section 16a, and a plurality of conductor lines are disposed on each flexible printed circuit board and terminate at ends 8 closely positioned in the mid-section 16a and ends 16 spaced at greater distances at the outer areas 14 and 15, it being appreciated that the outer areas 14 and 15 have a width substantially larger than the width of the mid-section to accommodate connection with contacts of the electrical control circuit. The arrangement of the ends 16 of the conductor lines at the outer areas of the flexible printed circuit boards is preferably in a customary screen measure.

The display device 1 has a width with a central longitudinal axis passing transversely therethrough and the flexible printed circuit board 10, as illustrated in FIG. 2b, has a configuration symmetrical about the longitudinal axis while the flexible printed circuit board 15, as illustrated in FIG. 2a, has a mid-section disposed on one side of the longitudinal axis and outer areas 14 and 15 extending from the mid-section toward the opposite side of the longitudinal axis. The flexible printed circuit board 11 has a narrow mid-section 16a disposed on the opposite side of the longitudinal axis with the outer areas thereof extending from the mid-section toward the one side of the longitudinal axis, and the width of the outer areas of each of the flexible printed circuit boards 9, 10 and 11 corresponds to the width of the display device while the total width of the mid-sections 16a of the flexible printed circuit boards 9, 10 and 11 together approximates the width of the liquid crystal cell 1.

In order to fix the flexible printed circuit boards 9, 10 and 11 with respect to each other and in proper position relative to the conductive rubber strands 6 and 7 in the display device, a mounting plate 17 is utilized, the mounting plate carrying centering pins received in holes 18 in the mid-sections of the flexible printed circuit boards. The mounting plate 17 is preferably made of plastic to be secured with the flexible printed circuit boards by heat sealing; however, the flexible printed circuit boards can also be cemented with the mounting plate. In order to facilitate unimpeded movement of the outer areas 14 and 15 of the flexible printed circuit boards with respect to each other, the length of the mid-sections of each of the flexible printed circuit boards is greater than the length of mounting plate 17 as is best shown in FIG. 3.

The outer areas 14 and 15 of the flexible printed circuit boards are each provided with centering holes 19 which can be engaged by centering pins (not shown) molded to printed circuit boards 20 which support the electronic control circuit for the display device. The outer areas of the flexible printed circuit boards can be connected with discrete elements, such as transistors 21, resistors 22 or integrated circuits, as well as with circuitry carried on the rigid printed circuit boards 20, and the contacts of these discrete elements can be soldered to the conductor lines on the flexible printed circuit board.

From the above, it will be appreciated that with the connection apparatus of the present invention, a plurality of three flexible printed circuit boards are arranged to provide connection between an electronic control circuit and a display device with one of the flexible printed circuit boards having a width symmetrical to a longitudinal axis through the display device, another printed circuit board having a mid-section on one side of the longitudinal axis and outer areas extending or widening toward the opposite side of the longitudinal axis and the third printed circuit board having a mid-section on the opposite side of the longitudinal axis with outer areas extending or widening toward the one side of the longitudinal axis, and the outer areas of all of the flexible printed circuit boards have a width corresponding to the width of the display device such that the apparatus requires comparatively little space and discrete elements can be simply connected with the conductor lines at the outer areas of the flexible printed circuit boards since the outer areas of the flexible printed circuit boards can be moved with respect to one another without mutual interference. In the case of display devices of a more complex nature, it is preferred that for each display unit, three flexible printed circuit boards be utilized in the arrangement described above.

The mounting plate 17 is conventionally utilized with liquid crystal displays for, among other things, support of a light source in the form of a photoconductor arranged on the side of the display facing away from an observer, and the mounting plate is, thus, advantageously utilized in accordance with the present invention for securing the individual flexible printed circuit boards 9, 10 and 11 relative to each other and to the display device by means of the centering pins engaging corresponding holes in the mid-sections of the flexible printed circuit boards.

The length of the mid-sections of the flexible circuit boards being greater than the length of the mounting plate increases flexibility of the individual flexible printed circuit boards and prevents the flexible printed circuit boards from interfering with each other in the area of the mounting plate to move the flexible printed boards and require repositioning in proper planes by force.

The use of centering holes in the outer areas of the flexible printed circuit boards has the advantage of permitting quick and exact connection of the outer areas of the flexible printed circuit boards with the conductor lines on a rigid printed circuit board supporting the electronic control circuit when the rigid printed circuit boards are provided with pins for engaging the centering holes. This is particularly advantageous when the flexible printed circuit boards serve merely as electrical connection elements between the contacts of the electrical control circuit and the display device.

Inasmuch as the present invention is subject to many variations, modifications and changes in detail, it is intended that all subject matter discussed above or shown in the accompanying drawings be interpreted as illustrative and not in a limiting sense.

What is claimed is:

1. Apparatus for electrically connecting a plurality of closely positioned contacts of a device, preferably a display device, with a plurality of spaced contacts of an electronic circuit controlling the device, comprising a plurality of flexible printed circuit boards each having a narrow mid-section and two outer end areas each of which is spaced from said mid-section and has a width greater than the width of said mid-section, and a plurality of conductor lines extending from said mid-section for connection with a portion of the closely positioned contacts of the device to said outer areas for connection with a portion of the spaced contacts of the electronic circuit, wherein the device has a width and a central axis passing transversely therethrough, said plurality of circuit boards including a first flexible printed circuit board having a configuration symmetrical about said axis, a second flexible printed circuit board having its mid-section disposed on one side of said axis and its end areas extending from its mid-section toward the opposite side of said axis, and a third flexible printed circuit board having its mid-section disposed on said opposite side of said axis and its end areas extending from its mid-section toward said one side of said axis, said end areas of said first, second and third flexible printed circuit boards each having the same width.

2. The apparatus as recited in claim 1 wherein said conductor lines terminate at said outer areas at ends spaced to correspond to customary screen measures.

3. The apparatus as recited in claim 1 and further comprising a mounting plate for holding said mid-sections of said flexible printed circuit boards adjacent the display device.

4. The apparatus as recited in claim 3 wherein said mounting plate carries centering pin means and said flexible printed circuit boards have hole means therein for receiving said centering pin means.

5. The apparatus as recited in claim 3 wherein said mounting plate and said mid-sections of said flexible printed circuit boards are cemented together.

6. The apparatus as recited in claim 3 wherein said mounting plate is made of plastic and said flexible printed circuit boards are secured to said mounting plate by heat sealing.

7. The apparatus as recited in claim 3 wherein the length of said mid-section of each of said flexible printed circuit boards is greater than the length of said mounting plate along said longitudinal axis.

8. The apparatus as recited in claim 3 wherein said outer areas of said flexible printed circuit boards have holes therein adapted to receive positioning pins.

* * * * *